United States Patent
Suzuki et al.

(10) Patent No.: US 8,933,342 B2
(45) Date of Patent: Jan. 13, 2015

(54) WIRING SUBSTRATE AND METHOD OF MANUFACTURING THE SAME

(71) Applicant: NGK Spark Plug Co., Ltd., Nagoya, Aichi-ken (JP)

(72) Inventors: Kenji Suzuki, Ichinomiya (JP); Masanori Kito, Iwakura (JP); Yuma Otsuka, Komaki (JP); Hisayoshi Kamiya, Nagoya (JP); Tsuyoshi Tanabashi, Mizuho (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 33 days.

(21) Appl. No.: 13/624,310

(22) Filed: Sep. 21, 2012

(65) Prior Publication Data

US 2013/0075141 A1    Mar. 28, 2013

(30) Foreign Application Priority Data

Sep. 22, 2011 (JP) ................. 2011-207478

(51) Int. Cl.
*H05K 1/16* (2006.01)
*H05K 1/02* (2006.01)
*H05K 3/24* (2006.01)
*H05K 1/03* (2006.01)

(52) U.S. Cl.
CPC ............. *H05K 1/0246* (2013.01); *H05K 3/242* (2013.01); *H05K 1/0251* (2013.01); *H05K 1/0306* (2013.01); *H05K 1/167* (2013.01); *H05K 2201/0317* (2013.01)
USPC .......................................... 174/260; 338/205

(58) Field of Classification Search
CPC ... H05K 1/0246; H05K 3/242; H05K 1/0251; H05K 1/167; H05K 1/0306; H05K 1/16; H05K 2201/0317; H05K 3/4602; H05K 3/4061; H05K 3/4069; H05K 3/4644; H05K 3/42; H01C 7/003
USPC .......... 174/250–268; 361/760–761, 766, 767, 361/772, 782, 793; 338/205
See application file for complete search history.

(56) References Cited

U.S. PATENT DOCUMENTS

| | | | |
|---|---|---|---|
| 3,904,461 A | * | 9/1975 | Estep et al. ................. 216/16 |
| 8,325,007 B2 | * | 12/2012 | Smith et al. ................. 338/328 |
| 2010/0039211 A1 | * | 2/2010 | Wang et al. ................. 338/204 |

FOREIGN PATENT DOCUMENTS

| JP | S63-188903 A | 8/1988 |
|---|---|---|
| JP | 4-102385 A | 4/1992 |
| JP | 2005-243861 A | 9/2005 |

OTHER PUBLICATIONS

Japanese Patent Office, Notification of Reason for Rejection issued in corresponding Japanese application No. 2011-207478, dispatched Jul. 1, 2014.

*Primary Examiner* — Ishwarbhai B Patel
(74) *Attorney, Agent, or Firm* — Stites & Harbison PLLC; Jeffrey A. Haeberlin; James R. Hayne

(57) ABSTRACT

A wiring substrate includes a substrate main body having a first main face and a second main face opposite the first main face; a resistor formed on the first main face; a plurality of first-main-face-side wiring layers which are each formed on the resistor and which each include a grounding metal layer formed of a metal having a resistance lower than that of the resistor and a conductor layer formed on the grounding metal layer; a second-main-face-side wiring layer formed on the second main face; and a via which is formed in the substrate main body and which establishes electrical connectivity between the first-main-face-side wiring layers and the second-main-face-side wiring layer. The wiring substrate further includes a conductive covering layer which covers an upper surface and substantially covers the side surfaces of each of the first-main-face-side wiring layers.

6 Claims, 10 Drawing Sheets

WIRING SUBSTRATE AND METHOD OF MANUFACTURING THE SAME

CROSS REFERENCE TO RELATED APPLICATIONS

The present application claims priority from Japanese Patent Application No. 2011-207478, which was filed on Sep. 22, 2011, the disclosure of which is herein incorporated by reference in its entirety.

BACKGROUND OF THE INVENTION

1. Field of the Invention

The present invention relates to a wiring substrate having a resistor and to a method of manufacturing the same.

2. Description of Related Art

In recent years, a resistor is formed on a main face of a ceramic multilayer wiring substrate by means of sputtering or the like so as to realize impedance matching of signal wiring of the ceramic multilayer wiring substrate. The resistor suppresses reflection of signals, and prevents generation of noise and deterioration of signals.

Meanwhile, a wiring layer (as used herein, "a wiring layer" refers to a stack of conductive layers) is provided on the resistor. This wiring layer includes two or more film-like conductor portions or layers used for, for example, leading signals to the outside via the ceramic multilayer wiring substrate or applying an external voltage via the ceramic multilayer wiring substrate. Also, anther wiring layer (a stack of conductive layers) is provided on the back surface of the ceramic multilayer wiring substrate. This wiring layer includes a film-like conductor portion which is electrically connected to at least one of the above-mentioned two or more film-like conductor portions via the ceramic multilayer wiring substrate and the resistor.

In general, the above-mentioned wiring layer is an electrically conductive film formed of copper, gold, or the like, or a film-like laminate including, for example, a Cu layer, an Ni layer, and an Au layer. In the case of the later film-like laminate, the Ni layer located in the middle functions as a conductive bonding layer for improving the adhesion between the Cu layer located below the Ni layer and the Au layer located above the Ni layer (Patent Document 1).

The above-described wiring layer is formed by a process of uniformly forming a film or a film-like laminate on the resistor and then etching the film or the laminate in the thickness direction. However, if such etching in the thickness direction is performed, fibrous foreign objects, so-called "whiskers," are formed on the side surface of the film or the Cu layer of the laminate such that the whiskers extend outward. Such "whiskers" cause various problems. For example, adjacent wiring layers formed on the resistor can be electrically connected through the "whiskers" whereby a short circuit is formed between these adjacent wiring layers.

Also, since the above-mentioned etching is generally performed through use of an inorganic acid or an organic acid, etching is performed anisotropically, particularly in the case where adjacent wiring layers are formed on the resistor through etching. Thus, particularly in the case where each of the conductor portions is formed of the above-mentioned film-like laminate, the etching may proceed excessively at a lower portion of the film-like laminate such that an undercut is formed. In such a case, the adhesion strength between the laminate (i.e., the conductor portion) and the resistor decreases, and various problems may occur. For example, the conductor portion may separate from the resistor.

RELATED ART DOCUMENTS

Patent Documents

Patent Document 1 is Japanese Patent Application Laid-Open (kokai) No. H4-102385.

BRIEF SUMMARY OF THE INVENTION

An object of the present invention is to solve the above-mentioned problem involved in the manufacture of a wiring substrate which has a resistor formed on a substrate, such as a ceramic multilayer wiring substrate, and in which a plurality of wiring layers including film-like conductor portions are formed on the resistor. Specifically, the object of the present invention is to suppress generation of whiskers at the time of formation of the plurality of wiring layers through etching, so as to prevent formation of a short circuit between the plurality of wiring layers and to prevent undercut of the film-like conductor portions of the wiring layers, to thereby increase the adhesion strength between the plurality of wiring layers and the substrate.

In order to achieve the above-described object, the present invention provides a wiring substrate comprising:

a substrate main body having a first main face and a second main face opposite the first main face;

a resistor formed on the first main face;

a plurality of first-main-face-side wiring layers which each are formed on the resistor and which each include a grounding metal layer formed of a metal having a resistance lower than that of the resistor, and a conductor layer formed on the grounding metal layer, the plurality of first-main-face-side wiring layers each having an upper surface and side surfaces;

a second-main-face-side wiring layer formed on the second main face; and a via which is formed in the substrate main body and which establishes electrical connectivity between the plurality of first-main-face-side wiring layers and the second-main-face-side wiring layer, the wiring substrate including a conductive covering layer which covers the upper surface and substantially covers the side surfaces of each of the plurality of first-main-face-side wiring layers.

The present invention also provides a method of manufacturing a wiring substrate which includes a substrate main body having a first main face and a second main face opposite the first main face; a resistor formed on the first main face; two first-main-face-side wiring layers which are each formed on the resistor and which each include a first grounding metal layer formed of a metal having a resistance lower than that of the resistor, and a conductor layer formed on the first grounding metal layer; a second-main-face-side wiring layer formed on the second main face; and a via which is formed in the substrate main body and which establishes electrical connectivity between the two first-main-face-side wiring layers and the second-main-face-side wiring layer, the method comprising:

forming the resistor on the first main face such that the resistor is electrically connected to the via;

forming the first grounding metal layer on the resistor, the first grounding metal layer having a resistance lower than that of the resistor, and forming a second grounding metal layer on the second main face such that the second grounding metal layer is electrically connected to the via;

forming first and second mask layers having openings on the first and second grounding metal layers, respectively, and forming in the openings a first conductor layer and a second conductor layer on the first and second grounding metal layers, respectively, to thereby form the two first-main-face-side wiring layers and the second-main-face-side wiring layer;

removing the first and second mask layers, and forming a third mask layer on the first grounding metal layer between the two first-main-face-side wiring layers;

forming a conductive covering layer which covers the upper surface and the side surfaces of each of the two first-main-face-side wiring layers by performing electroplating while using the via and the first grounding metal layer as an electricity supply path; and removing the third mask layer and removing a portion of the first grounding metal layer located between the two first-main-face-side wiring layers.

According to the present invention, there is provided a wiring substrate in which a resistor is formed on a first main face of a substrate main body, and a plurality of first-main-face-side wiring layers are formed on the resistor. Each of the first-main-face-side wiring layers includes two film-like conductor portions; i.e., a first grounding metal layer formed of a metal having a resistance lower than that of the resistor, and a first conductor layer formed on the first grounding metal layer. Also, a second-main-face-side wiring layer is formed on a second main face of the substrate main body opposite the first main face. The second-main-face-side wiring layer is electrically connected to one of the first-main-face-side wiring layers through a via formed in the substrate main body. Before the first-main-face-side wiring layers are defined, the upper and side surfaces of the first-main-face-side wiring layers are covered by a conductive covering layer. After that, a portion of the first grounding metal layer extending between two adjacent first-main-face-side wiring layers is etched in the thickness direction so as to remove that portion and divide the first grounding metal layer into two portions, whereby the first-main-face-side wiring layers are defined.

In defining the first-main-face-side wiring layers, the first grounding metal layer and the first conductor layer which constitute the first-main-face-side wiring layers, excluding the portion of the first grounding metal layer to be removed for dividing the first grounding metal layer into two portions, are not exposed to, for example, the etchant. Therefore, it is possible to prevent formation of fibrous foreign objects, called "whiskers," which have conventionally been formed when these layers are etched, such that the whiskers extend outward. As a result, it is possible to avoid problems, such as a problem that the first-main-face-side wiring layers formed on the resistor are electrically connected with each other via the "whiskers," which results in formation of a short circuit.

Also, as described above, the first-main-face-side wiring layers, excluding the portion of the first grounding metal layer to be removed for dividing the first grounding metal layer into two portions, are not exposed to, for example, etchant. Therefore, even when the etchant stagnates, it is possible to prevent anisotropic etching. Therefore, it is possible to prevent excessive etching of a lower portion of each first-main-face-side wiring layer; i.e., a lower portion of the first grounding metal layer or the like, which would otherwise result in formation of an undercut. Accordingly, it is possible to avoid problems, such as a decrease in the adhesion strength between the first-main-face-side wiring layers and the resistor, which results in separation of the first-main-face-side wiring layers from the resistor.

Notably, the above-mentioned conductive covering layer is not removed by etching and remains after the etching. Therefore, in the obtained wiring substrate, the conductive covering layer covers the upper and substantially covers the side surfaces of the first-main-face-side wiring layers.

As described above, according to the present invention, it is possible to solve the problem involved in manufacture of a wiring substrate which has a resistor formed on a substrate, such as a ceramic multilayer wiring substrate, and in which a plurality of wiring layers including film-like conductor portions are formed on the resistor. Specifically, it is possible to suppress generation of whiskers at the time of formation of the plurality of wiring layers through etching, so as to prevent formation of a short circuit between the plurality of wiring layers and to prevent undercut of the film-like conductor portions of the wiring layers, to thereby increase the adhesion strength between the plurality of wiring layers and the substrate.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

Embodiments of the present invention will now be described with reference to the drawings.

First Embodiment

Wiring Substrate

Figure 1:
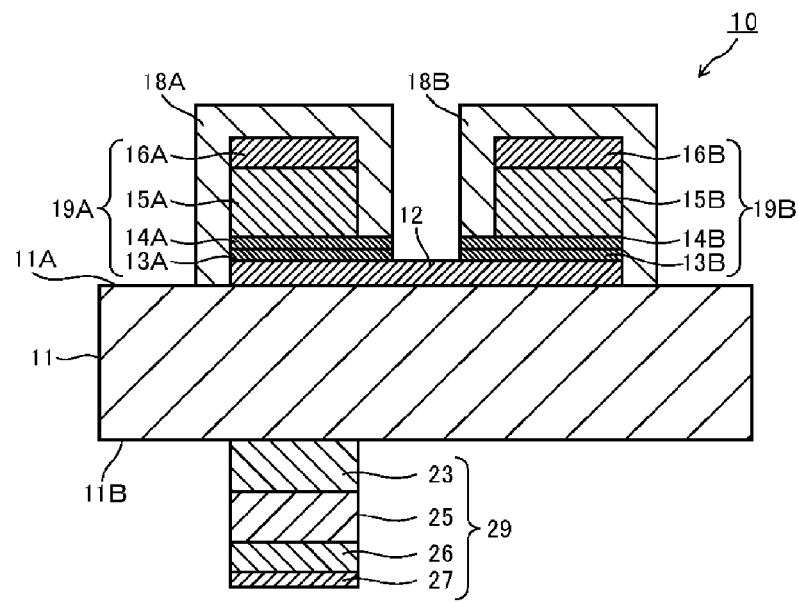
FIG. 1 is a sectional view schematically showing the structure of a wiring substrate according to a first embodiment.

FIG. 1 is a sectional view schematically showing the structure of a wiring substrate according to the present embodiment. As shown in FIG. 1, a wiring substrate 10 of the present embodiment includes a substrate main body 11 and a film-like resistor 12 formed of, for example, $Ta_2N$. The resistor 12 is formed on a first main face 11A of the substrate main body 11 such that the resistor 12 is electrically connected to an internal wiring layer (e.g., a via) formed in the substrate main body 11. The substrate main body 11 may be formed of, for example, a ceramic multilayer wiring substrate.

A first-main-face-side wiring layer 19A (a stack of layers collectively called "wiring layer 19A") is provided on the resistor 12. The first-main-face-side wiring layer 19A is constituted by sequentially forming a first portion 13A of a first grounding metal lower layer formed of, for example, Ti and having a thickness of 0.2 μm, a first portion 14A of a first grounding metal upper layer formed of, for example, Cu and having a thickness of 0.5 μm, a first portion 15A of a first conductor layer formed of, for example, Cu, and a first portion 16A of a first conducive bonding layer formed of, for example, Ni. In the present example, the first grounding metal layer is composed of two layers (upper and lower layers); however, the first grounding metal layer may be composed of a single layer formed of, for example, Cu.

Similarly, a first-main-face-side wiring layer 19B (a stack of layers collectively called "wiring layer 19B"), which is located adjacent to the first-main-face-side wiring layer 19A, is provided on the resistor 12. The first-main-face-side wiring layer 19B is constituted by sequentially forming a second portion 13B of the first grounding metal lower layer formed of, for example, Ti and having a thickness of 0.2 μm, a second portion 14B of the first grounding metal upper layer formed of, for example, Cu and having a thickness of 0.5 μm, a second portion 15B of the first conductor layer formed of, for example, Cu, and a second portion 16B of the first conducive bonding layer formed of, for example, Ni. In the present example, the first grounding metal layer is composed of two layers (upper and lower layers); however, the first grounding metal layer may be composed of a single layer formed of, for example, Cu.

The first-main-face-side wiring layer 19A is substantially covered by a conductive covering layer 18A composed of, for example, an Ni layer and an Au layer such that the upper and side surfaces of the first-main-face-side wiring layer 19A are substantially covered. Specifically, the conductive covering layer 18A covers the side surfaces of the first portions 13A and 14A of the first grounding metal lower and upper layers, excluding the side surfaces facing the first-main-face-side wiring layer 19B, the side surfaces of the first portion 15A of the first conductor layer, and the side and upper surfaces of the first portion 16A of the conducive bonding layer. Notably, the conductive covering layer 18A has a thickness of, for example, 1 to 3 μm.

The Ni layer contained in the conductive covering layer 18A enhances the adhesion between the conductive covering layer 18A and the first-main-face-side wiring layer 19A. The Au layer contained in the conductive covering layer 18A enhances the electrical conductivity of the conductive covering layer 18A; i.e., the electrical conductivity of the wiring substrate 10. However, the conductive covering layer 18A does not necessarily have a double-layer structure as described above, and may have a single layer structure including an Ni layer or an Au layer.

Similarly, the first-main-face-side wiring layer 19B is substantially covered by a conductive covering layer 18B such that the upper and side surfaces of the first-main-face-side wiring layer 19B are substantially covered. Specifically, the conductive covering layer 18B covers the side surfaces of the second portions 13B and 14B of the first grounding metal lower and upper layers, excluding the side surfaces facing the first-main-face-side wiring layer 19A, the side surfaces of the second portion 15B of the first conductor layer, and the side and upper surfaces of the second portion 16B of the conducive bonding layer. Notably, the conductive covering layer 18B has a thickness of, for example, 1 to 3 μm.

The Ni layer contained in the conductive covering layer 18B enhances the adhesion between the conductive covering layer 18B and the first-main-face-side wiring layer 19B. The Au layer contained in the conductive covering layer 18B enhances the electrical conductivity of the conductive covering layer 18B; i.e., the electrical conductivity of the wiring substrate 10. However, the conductive covering layer 18B does not necessarily have a double-layer structure as described above, and may have a single layer structure including an Ni layer or an Au layer.

Also, a second-main-face-side wiring layer 29 is provided on a second main face 11B of the substrate main body 11 opposite the first main face 11A such that the second-main-face-side wiring layer 29 faces the first-main-face-side wiring layer 19A; namely, the second-main-face-side wiring layer 29 is located immediately below the first-main-face-side wiring layer 19A. The second-main-face-side wiring layer 29 is constituted by sequentially forming a second grounding metal layer 23 including, for example, a Ti layer and/or a Cu layer, a second conductor layer 25 formed of, for example, Cu, a second conducive bonding layer 26 formed of, for example, Ni, and a third conductor layer 27 formed of, for example, Au.

A plurality of unillustrated but known to those skilled in the art internal wiring layers are formed in the substrate main body 11 such that the internal wiring layers become parallel to the first main face 11A and the second main face 11B. As shown in FIG. 20, the substrate main body 11 also includes inter-layer connection members such as via conductors 40 which are known to those skilled in the art. The via conductors 40 are formed in the substrate main body 11 so as to establish (i.e., provide) electrical connectivity (i.e., electrical communication or connection) between the internal wiring layers and to establish (i.e., provide) electrical connectivity (i.e., electrical communication or connection) between the first-main-face-side wiring layer 19A formed on the first main face 11A of the substrate main body 11 and the second-main-face-side wiring layer 29 formed on the second main face 11B of the substrate main body 11 through electrode pads formed on these main faces 11A and 11B. The via conductors 40 shown in FIG. 20 is exemplary of via conductors unillustrated in FIGS. 1-19.

In the wiring substrate 10 of the present embodiment, the resistor 12 on the first main face 11A of the substrate main body 11 allows impedance matching of a signal wiring layer of the internal wiring layers of the substrate main body 11 and suppresses reflection of signals, to thereby prevent generation of noise and deterioration of signals.

Meanwhile, the first-main-face-side wiring layer 19A and the first-main-face-side wiring layer 19B are formed on the resistor 12, and the second-main-face-side wiring layer 29 is formed on the second main face 11B of the substrate main body 11 at a position immediately below the first-main-face-side wiring layer 19A such that the second-main-face-side wiring layer 29 is electrically connected to the first-main-face-side wiring layer 19A. Accordingly, a signal can be led to the outside through the substrate main body 11 or an external voltage can be applied through the substrate main body 11.

Also, as described above, the upper and side surfaces of the first-main-face-side wiring layers 19A and 19B are substantially covered by the conductive covering layers 18A and 18B, respectively. Therefore, as will be described below, it is possible to suppress the generation of whiskers of the first conductor layer which partially constitutes the first-main-face-side wiring layers 19A and 19B and formation of undercuts of the first conductor layer, when these first-main-face-side wiring layers 19A and 19B are formed with their shapes being defined through etching. Accordingly, it is possible to prevent the first-main-face-side wiring layers 19A and 19B from coming into electrical contact with another adjacent first-main-face-side wiring layer, which would otherwise result in formation of a short circuit therebetween. Also, it is possible to prevent a decrease in the adhesion strength between the first-main-face-side wiring layers 19A and 19B and the resistor 12, which decrease would otherwise result in separation of the first-main-face-side wiring layers 19A and 19B from the resistor 12.

In the present embodiment, the conductive covering layers 18A and 18B are not formed on the mutually facing side surfaces of the first-main-face-side wiring layers 19A and 19B; namely, the side surfaces of the first portions 13A and 14A of the first grounding metal lower and upper layers of the first-main-face-side wiring layer 19A, which side surfaces face the first-main-face-side wiring layer 19B; and the side surfaces of the second portions 13B and 14B of the first grounding metal lower and upper layers of the first-main-face-side wiring layer 19B, which side surfaces face the first-main-face-side wiring layer 19A.

However, the portions of the first-main-face-side wiring layers 19A and 19B which are not covered by the conductive covering layers 18A and 18B are very small (1 μm or less). Also, the side surfaces of the first portions 13A and 14A of the first grounding metal lower and upper layers of the first-main-face-side wiring layer 19A, which side surfaces do not face the first-main-face-side wiring layer 19B and the side surfaces of the second portions 13B and 14B of the first grounding metal lower and upper layers of the first-main-face-side wiring layer 19B, which side surfaces do not face the first-main-face-side wiring layer 19A are covered by the conductive covering layers 18A and 18B.

Accordingly, despite the presence of small regions which are not covered by the conductive covering layers 18A and 18B, the above-described action and effect achieved by these covering layers 18A and 18B, such as suppression of generation of whiskers and suppression of formation of undercuts at the time of etching, are not impaired.

Notably, by properly controlling the regions in which the first grounding metal lower and upper layers are formed, the first grounding metal lower and upper layers; i.e., the first portions 13A, 14A and the second portions 13B, 14B of the first grounding metal lower and upper layers may be formed such that the first portions 13A, 14A and the second portions 13B, 14B have the same areas as those of the first and second portions 15A and 15B of the first conductor layer. This makes it possible to cover all the side surfaces of the first-main-face-side wiring layers 19A and 19B. In this case, the above-described action and effect become more remarkable.

Method of Manufacturing Wiring Substrate

Next, a method of manufacturing the wiring substrate shown in FIG. 1 will be described. FIGS. 2 to 17 are sectional views showing the steps of the wiring substrate manufacturing method according to the present embodiment.

Figure 2:
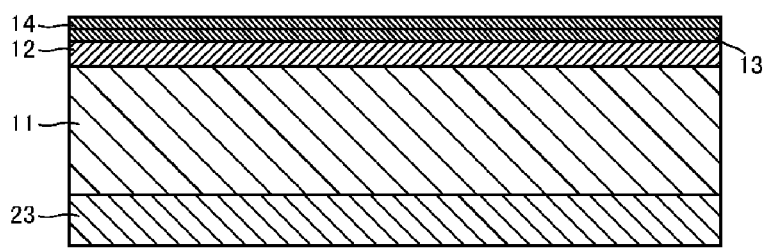
FIG. 2 is a sectional view showing a step of a method of manufacturing the wiring substrate according to the first embodiment.

First, as shown in FIG. 2, the substrate main body 11 is prepared, and the film-like resistor 12 is formed on the first main face 11A of the substrate main body 11 by, for example, a sputtering process. After that, the first grounding metal lower and upper layers 13 and 14 are formed on the resistor 12 by a sputtering process. Similarly, the second grounding metal layer 23 is formed on the second main face 11B of the substrate main body 11 by, for example a sputtering process. In the present embodiment, the resistor 12 is formed of $Ta_2N$, the first grounding metal lower layer 13 is formed of Ti, and the first grounding metal upper layer 14 is formed of Cu.

The resistor 12 and the first grounding metal lower and upper layers 13 and 14, which are formed on the first main face 11A of the substrate main body 11, are electrically connected to an unillustrated via conductor and an unillustrated internal wiring layer provided in the substrate main body 11. The second grounding metal layer 23, which is formed on the second main face 11B of the substrate main body 11, is also electrically connected to the unillustrated via conductor and internal wiring layer of the substrate main body 11. In the present embodiment, the second grounding metal layer 23 is composed of two layers; i.e., a Ti layer and a Cu layer.

Accordingly, the resistor 12 and the first grounding metal lower and upper layers 13 and 14 are electrically connected to the second grounding metal layer 23 via the ceramic multilayer wiring substrate 11 (the inter-layer connection member in the substrate). Therefore, the first conductor layer, which is subsequently formed on the first grounding metal upper layer 14, is also electrically connected to the second conductor layer, which is subsequently formed on the second grounding metal layer 23, via the substrate main body 11.

As a result, in a finally obtained wiring substrate, the first-main-face-side wiring layer formed on the first main face 11A of the substrate main body 11 and the second-main-face-side wiring layer formed on the second main face 11B of the substrate main body 11 are electrically connected together. Thus, another first-main-face-side wiring layer formed on the resistor 12 to be located adjacent to the above-mentioned first-main-face-side wiring layer is electrically connected to the above-mentioned first-main-face-side wiring layer and the above-mentioned second-main-face-side wiring layer via the resistor 12.

Figure 3:
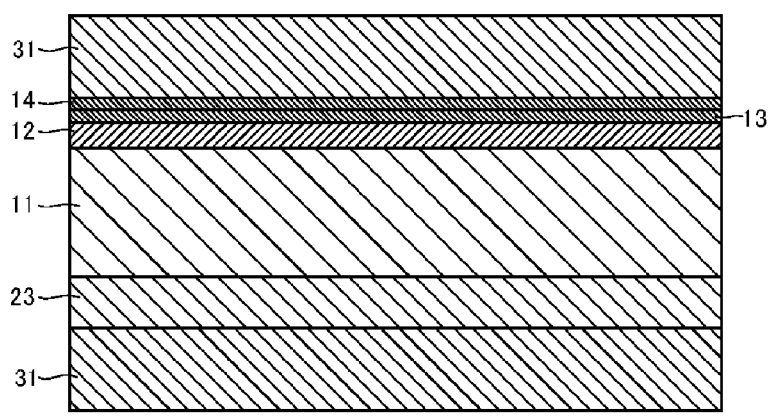
FIG. 3 is a sectional view showing another step of the method of manufacturing the wiring substrate according to the first embodiment.
Figure 4:
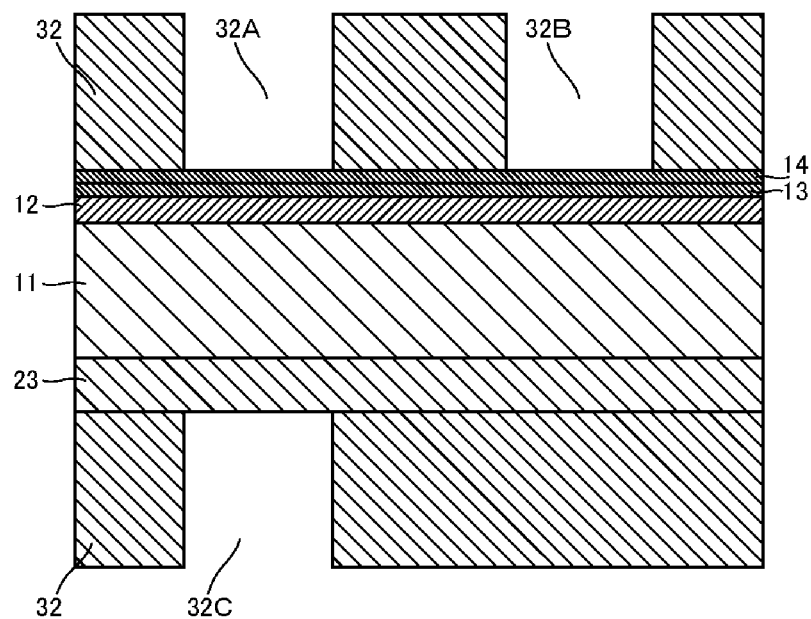
FIG. 4 is a sectional view showing another step of the method of manufacturing the wiring substrate according to the first embodiment.

Next, as shown in FIG. 3, a resist 31 is applied onto the upper and lower surfaces of the laminate formed in the step shown in FIG. 2; specifically, onto the first grounding metal upper layer 14 and the second grounding metal layer 23. Subsequently, exposure and developing processes are performed on the laminate via an unillustrated mask to thereby form resist masks 32 (a first mask layer and a second mask layer) which have openings 32A and 32B and an opening 32C, respectively, as shown in FIG. 4. Notably, the opening 32C is formed at a position which coincides with the position of the opening 32A.

Figure 5:
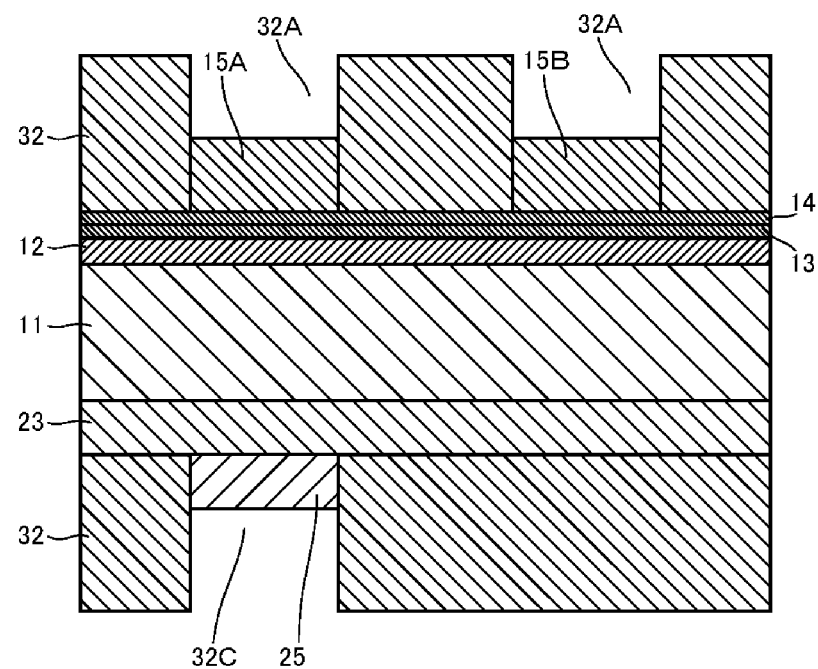
FIG. 5 is a sectional view showing another step of the method of manufacturing the wiring substrate according to the first embodiment.

Next, as shown in FIG. 5, the first conductor layer is formed in the openings 32A and 32B of the resist mask 32 by, for example, an electroplating process, whereby the first and second portions 15A and 15B of the first conductor layer are formed in these openings. Next, the second conductor layer 25 is formed in the opening 32C of the resist mask 32 by, for example, an electroplating process. In the present embodiment, the first conductor layer and the second conductor layer 25 are formed of Cu.

Figure 6:
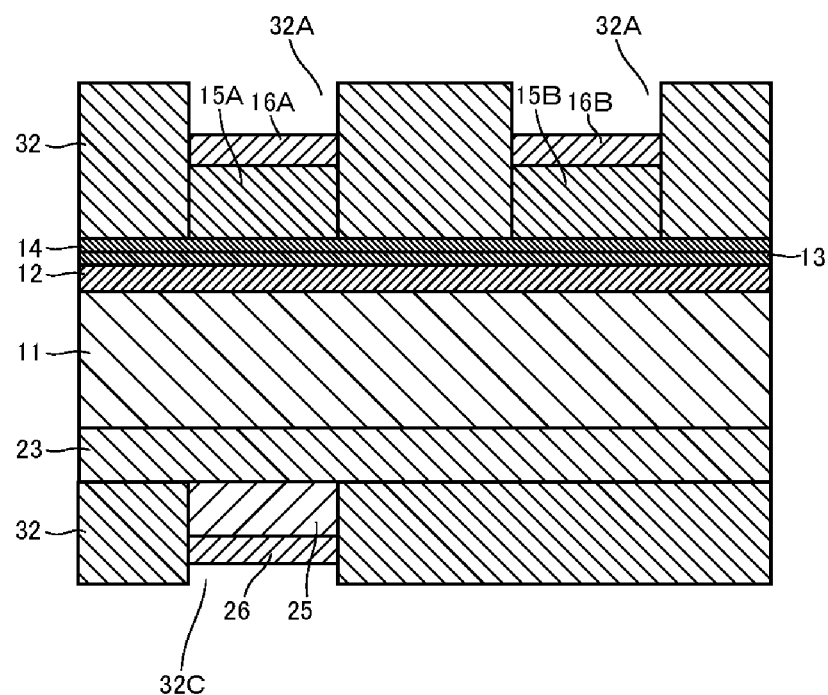
FIG. 6 is a sectional view showing another step of the method of manufacturing the wiring substrate according to the first embodiment.

Next, as shown in FIG. 6, the first conducive bonding layer is formed in the openings 32A and 32B of the resist mask 32 by, for example, an electroplating process, whereby the first and second portions 16A and 16B of the first conducive bonding layer are formed in these openings such that they are provided on the first and second portions 15A and 15B of the first conductor layer. Next, the second conducive bonding layer 26 is formed in the opening 32C of the resist mask 32 by, for example, an electroplating process, such that the second conducive bonding layer 26 is provided on the second conductor layer 25. In the present embodiment, the first conducive bonding layer and the second conducive bonding layer 26 are formed of Ni.

Figure 7:
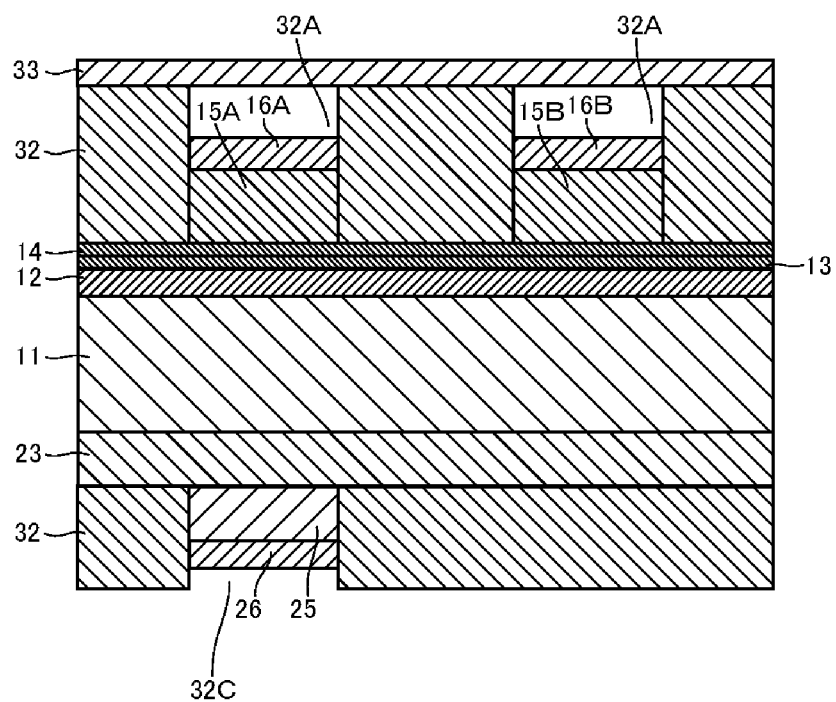
FIG. 7 is a sectional view showing another step of the method of manufacturing the wiring substrate according to the first embodiment.
Figure 8:
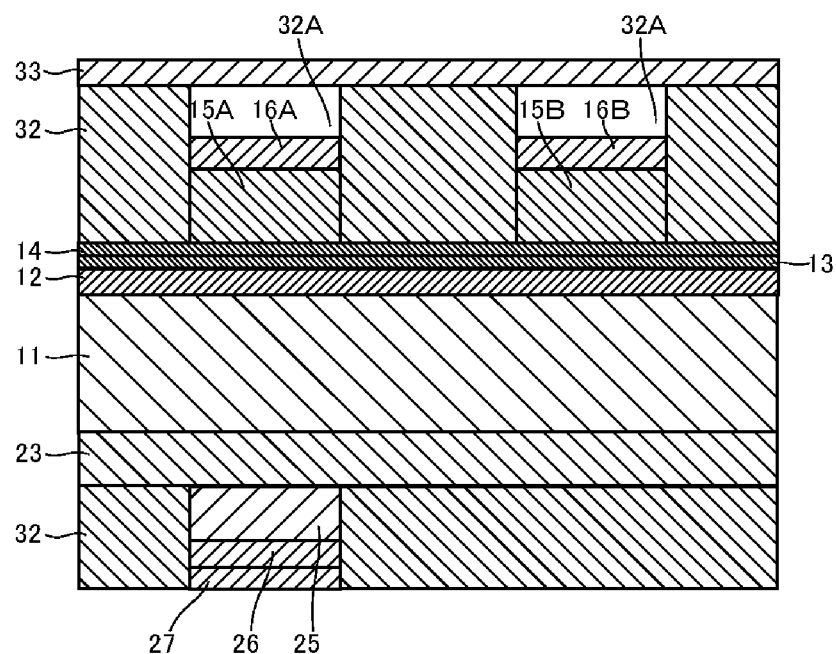
FIG. 8 is a sectional view showing another step of the method of manufacturing the wiring substrate according to the first embodiment.

After that, as shown in FIG. 7, a mask member 33 is formed on the upper surface of the laminate obtained in the step shown in FIG. 6 so as to mask the upper surface. Subsequently, as shown in FIG. 8, the third conductor layer 27 is formed in the opening 32C of the resist mask 32 by, for example, an electroplating process, such that the third conductor layer 27 is provided on the second conducive bonding layer 26. In the present embodiment, the third conductor layer 27 is formed of Au.

Figure 9:
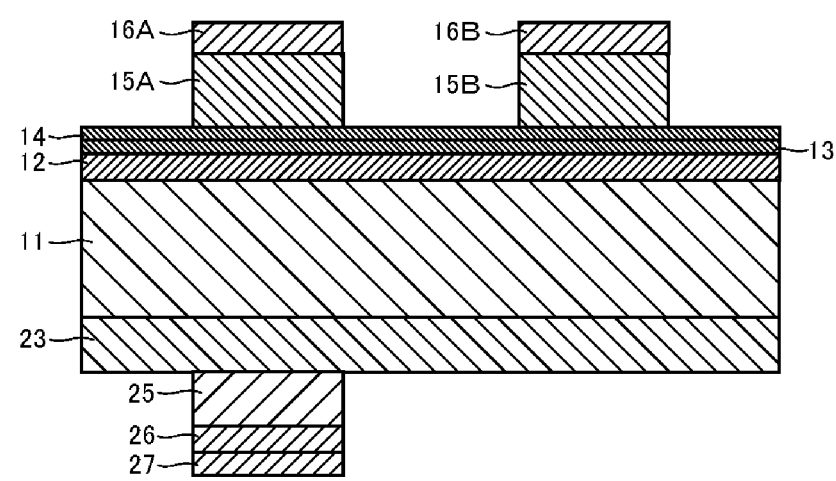
FIG. 9 is a sectional view showing another step of the method of manufacturing the wiring substrate according to the first embodiment.
Figure 10:
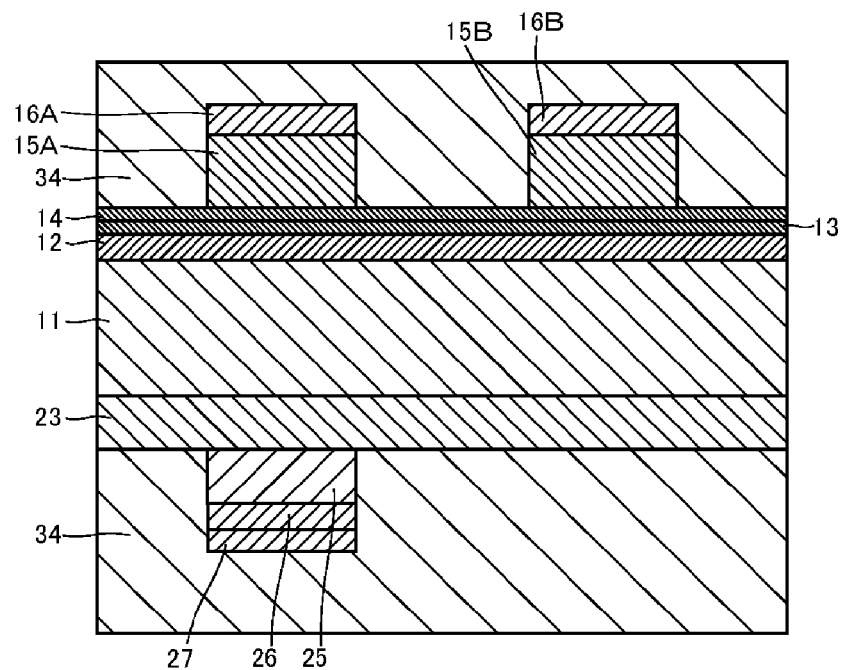
FIG. 10 is a sectional view showing another step of the method of manufacturing the wiring substrate according to the first embodiment.
Figure 11:
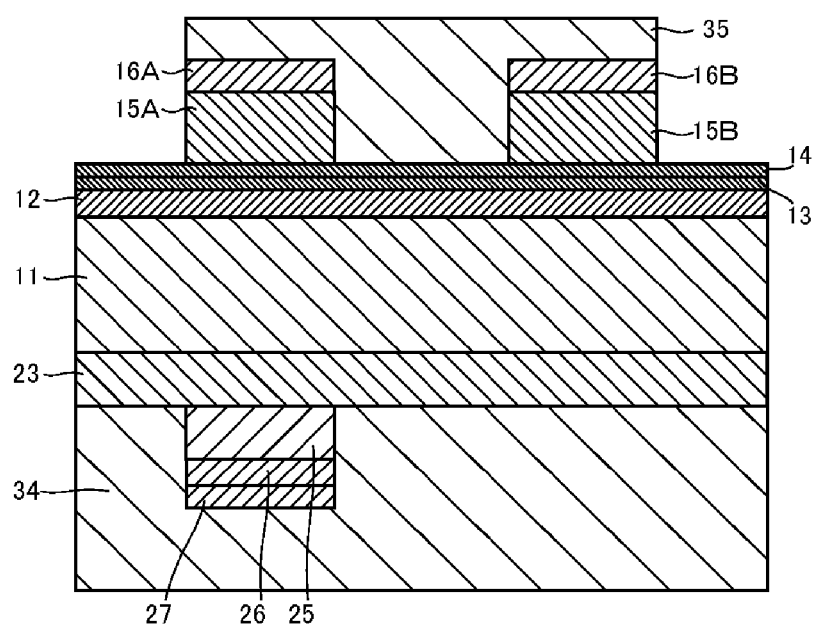
FIG. 11 is a sectional view showing another step of the method of manufacturing the wiring substrate according to the first embodiment.

Next, as shown in FIG. 9, the mask member 33 formed in the step shown in FIG. 7 is removed. Subsequently, as shown in FIG. 10, a resist 34 is again applied so as to cover the structure obtained in the step shown in FIG. 9. After that, as shown in FIG. 11, exposure and developing processes are performed on the structure via an unillustrated mask to thereby form a resist mask 35. Notably, the above-described exposure and developing processes are performed such that the side end surfaces of the resist mask 35 become flush with the side end surfaces of the first and second portions 15A and 15B of the first conductor layer, and become flush with the side end surfaces of the first and second portions 16A and 16B of the first conducive bonding layer.

Figure 12:
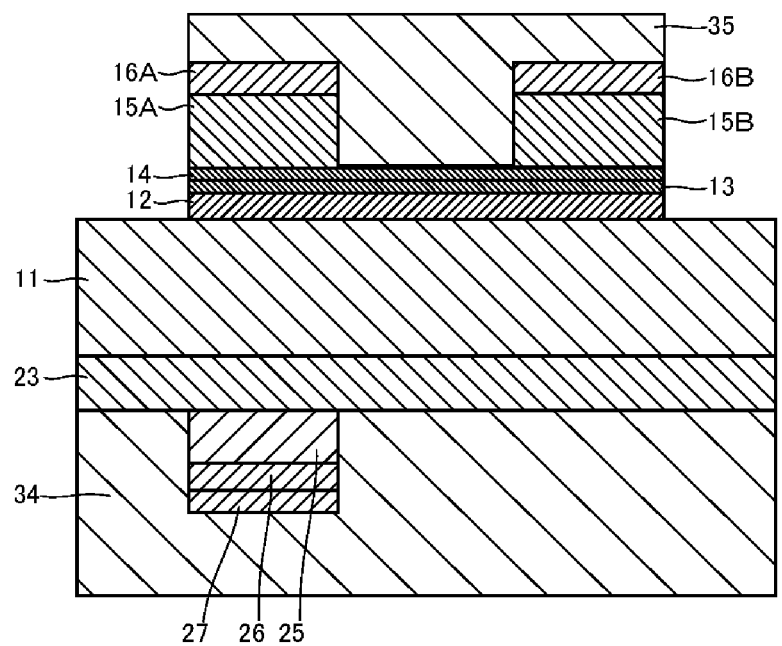
FIG. 12 is a sectional view showing another step of the method of manufacturing the wiring substrate according to the first embodiment.

Next, as shown in FIG. 12, etching is performed through the resist mask 35 by making use of, for example, an inorganic acid or an organic acid so as to remove portions of the resistor 12 and the first grounding metal lower and upper layers 13 and 14, which portions are located outward of the resist mask 35; i.e., portions of the resistor 12 and the first grounding metal lower and upper layers 13 and 14, which portions are exposed to the outside of the first and second portions 15A and 15B of the first conductor layer and the first and second portions 16A and 16B of the first conducive bonding layer. Further, the resist mask 35 is removed. As a result, as shown in FIG. 13, the side end surfaces of the resistor 12 and the first grounding metal lower and upper layers 13 and 14 are made substantially flush with the side end surfaces of the first and second portions 15A and 15B of the first conductor layer, and the side end surfaces of the first and second portions 16A and 16B of the first conducive bonding layer.

Figure 13:
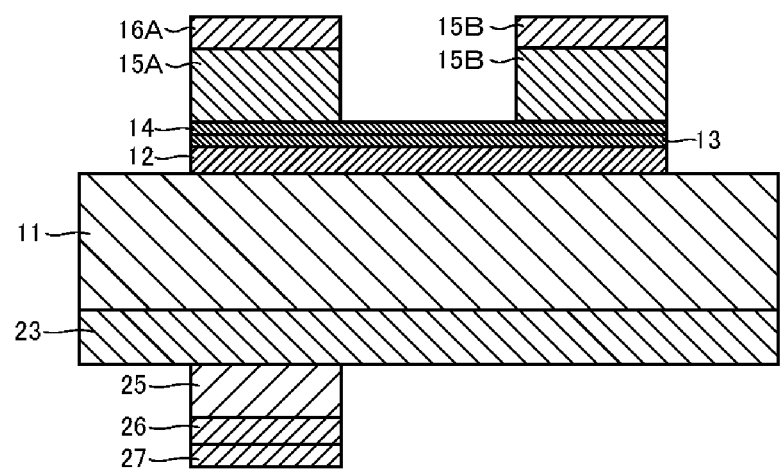
FIG. 13 is a sectional view showing another step of the method of manufacturing the wiring substrate according to the first embodiment.
Figure 14:
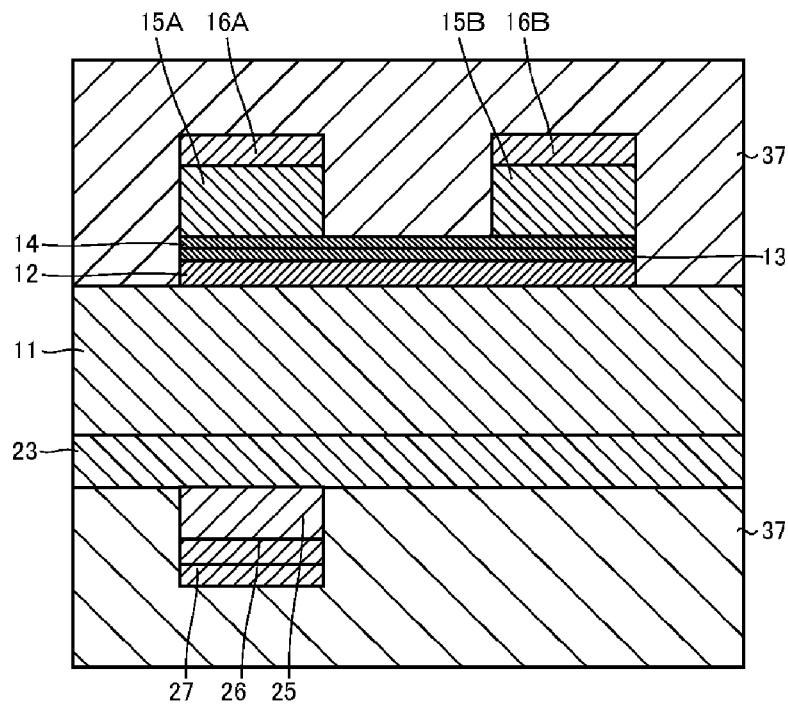
FIG. 14 is a sectional view showing another step of the method of manufacturing the wiring substrate according to the first embodiment.

Notably, in the structure shown in FIG. 13, as described above, the first portion 15A of the first conductor layer and the third conductor layer 27 are electrically connected via the substrate main body 11 (a via conductor or the like formed therein). Also, the second portion 15B of the first conductor layer and the second grounding metal layer 23 are electrically connected via the substrate main body 11, the resistor 12, and the first grounding metal lower and upper layers 13 and 14.

Figure 15:
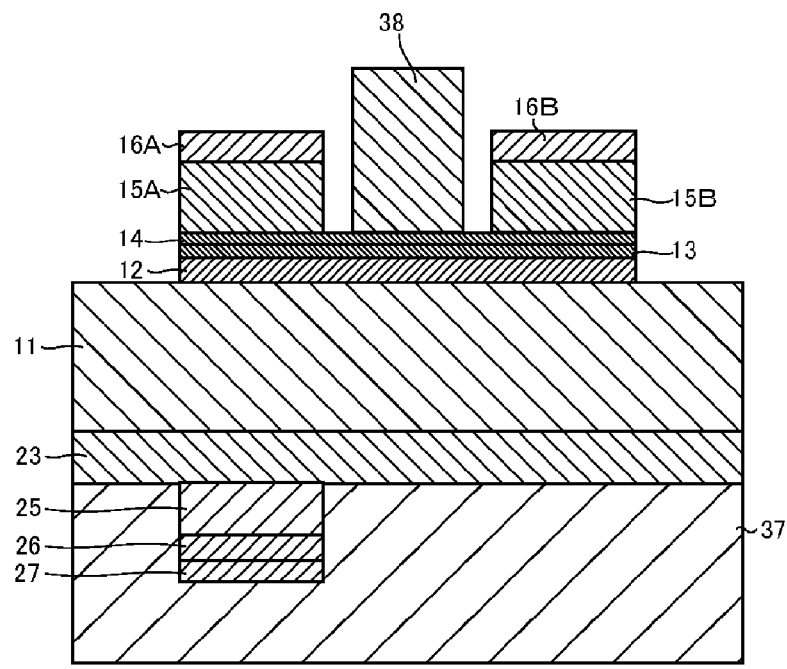
FIG. 15 is a sectional view showing another step of the method of manufacturing the wiring substrate according to the first embodiment.

Next, as shown in FIG. 14, a resist 37 is again applied to cover the structure obtained in the step shown in FIG. 13. After that, as shown in FIG. 15, exposure and developing processes are performed on the resist via an unillustrated mask to thereby form a plate-shaped resist mask 38 (a third mask layer) between the first and second portions 15A and 15B of the first conductor layer and between the first and second portions 16A and 16B of the first conducive bonding layer. Although not clearly shown in FIG. 15, the plate-shaped resist mask 38 is formed over the entire height of the first and second portions 15A and 15B of the first conductor layer as measured in the direction perpendicular to the sheet, and over the entire height of the first and second portions 16A and 16B of the first conducive bonding layer as measured in the direction perpendicular to the sheet.

Figure 16:
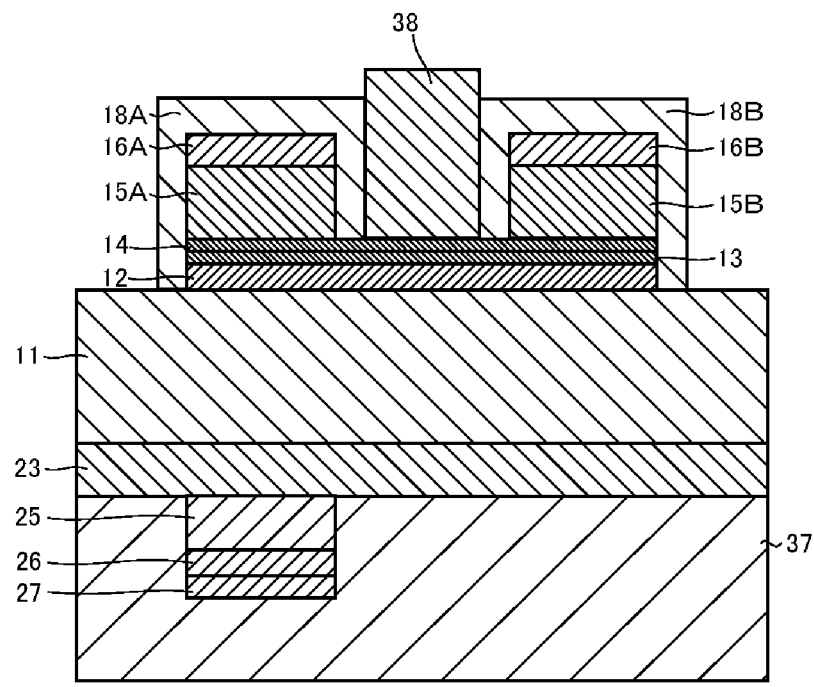
FIG. 16 is a sectional view showing another step of the method of manufacturing the wiring substrate according to the first embodiment.

Next, as shown in FIG. 16, with the second grounding metal layer 23 or the third conductor layer 27 formed on the second main face 11B of the substrate main body 11 being used as an electricity supply path, electroplating is carried out so as to form the conductive covering layers 18A and 18B such that they cover the side surfaces of the resistor 12 formed on the first main face 11A of the substrate main body 11, the side surfaces of the first grounding metal lower layer 13, the side surfaces of the first grounding metal upper layer 14, the side surfaces of the first and second portions 15A and 15B of the first conductor layer, and the upper and side surfaces of the first and second portions 16A and 16B of the first conducive bonding layer.

As described above, the conductive covering layers 18A and 18B are formed by electroplating performed with the second grounding metal layer 23 or the third conductor layer 27 being used as an electricity supply path. As described above, the first portion 15A of the first conductor layer and the second grounding metal layer 23 or the third conductor layer 27 are electrically connected through the substrate main body 11, and the second portion 15B of the first conductor layer and the second grounding metal layer 23 or the third conductor layer 27 are electrically connected through the substrate main body 11, the resistor 12, and the first grounding metal lower and upper layers 13 and 14.

Accordingly, the current applied to the second grounding metal layer 23 or the third conductor layer 27 is efficiently applied to the first and second portions 15A and 15B of the first conductor layer on which the conductive covering layers 18A and 18B are to be formed. Therefore, the conductive covering layers 18A and 18B can be formed quickly and uniformly on the first and second portions 15A and 15B of the first conductor layer, on which these covering layers are to be formed.

Notably, in the case where the first grounding metal lower and upper layers 13 and 14 are not provided between the first portion 15A of the first conductor layer and the second portion 15B of the first conductor layer and only the resistor 12 is provided therebetween unlike the structure shown in FIG. 16 (FIG. 13), the current applied to the second grounding metal layer 23 or the third conductor layer 27 is efficiently applied to the first portion 15A of the first conductor layer. However, in some cases, the applied current is not efficiently applied to the second portion 15B of the first conductor layer, because the second grounding metal layer 23 or the third conductor layer 27 is connected to the second portion 15B via the resistor 12. Therefore, in such a case, the conductive covering layer 18B is not uniformly formed on the second portion 15B of the first conductor layer.

Figure 17:
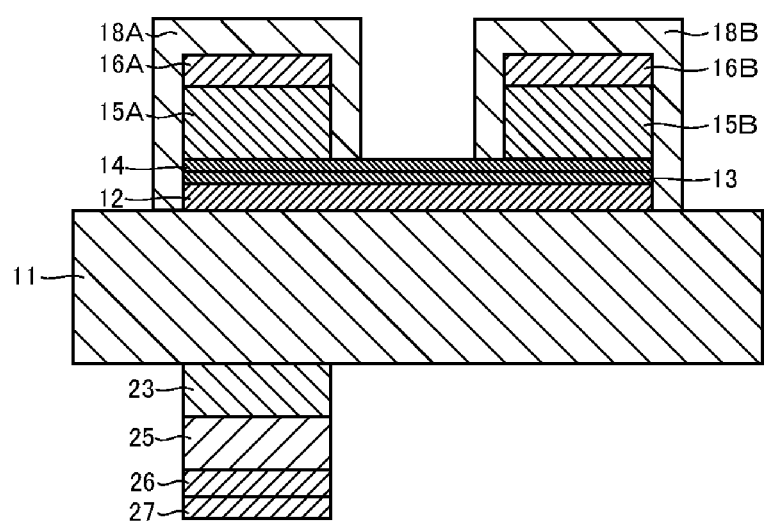
FIG. 17 is a sectional view showing another step of the method of manufacturing the wiring substrate according to the first embodiment.

Next, after removal of the plate-shaped resist mask 38 as shown in FIG. 17, portions of the first grounding metal lower and upper layers 13 and 14 between the conductive covering layers 18A and 18B are removed by etching performed through use of an inorganic acid or an organic acid, whereby the first grounding metal lower and upper layers 13 and 14 are divided. Thus, the first and second portions 13A and 13B of the first grounding metal lower layer and the first and second portions 14A and 14B of the first grounding metal upper layer as shown in FIG. 1 are formed. As a result, the first-main-face-side wiring layer 19A as shown in FIG. 1 is constituted. The first-main-face-side wiring layer 19A includes the first portion 13A of the first grounding metal lower layer, the first portion 14A of the first grounding metal upper layer, the first portion 15A of the first conductor layer, and the first portion 16A of the first conducive bonding layer, which are formed in this sequence. Similarly, the first-main-face-side wiring layer 19B as shown in FIG. 1 is constituted. The first-main-face-side wiring layer 19B includes the second portion 13B of the first grounding metal lower layer, the second portion 14B of the first grounding metal upper layer, the second portion 15B of the first conductor layer, and the second portion 16B of the first conducive bonding layer, which are formed in this sequence.

Notably, when the first grounding metal lower and upper layers 13 and 14 are etched through use of an inorganic acid or an organic acid, the conductive covering layers 18A and 18B function as protection members which protect the upper and side surfaces of the first-main-face-side wiring layers 19A and 19B.

Specifically, the conductive covering layer 18A protects the side surfaces of the first portions 13A and 14A of the first grounding metal lower and upper layers, excluding the side surfaces facing the second-main-face-side wiring layer 19B, the side surfaces of the first portion 15A of the first conductor layer, and the side and upper surfaces of the first portion 16A of the conducive bonding layer. Similarly, the conductive covering layer 18B protects the side surfaces of the second portions 13B and 14B of the first grounding metal lower and upper layers, excluding the side surfaces facing the first-main-face-side wiring layer 19A, the side surfaces of the second portion 15B of the first conductor layer, and the side and upper surfaces of the second portion 16B of the conducive bonding layer.

Accordingly, it is possible to suppress the formation of whiskers or undercuts of the first and second portions 15A and 15B of the first conductor layer and the first and second portions 14A and 14B of the first grounding metal upper layer, which constitute the first-main-face-side wiring layers 19A and 19B. Such whiskers or undercuts would otherwise be formed at the time of etching. As a result, it is possible to prevent the first-main-face-side wiring layers 19A and 19B from coming into electrical contact with another adjacent first-main-face-side wiring layer, which would otherwise result in formation of a short circuit therebetween. Also, it is possible to prevent the first-main-face-side wiring layers 19A and 19B from separating from the resistor 12, which separation would otherwise occur due to an decrease in the adhesion strength between the first-main-face-side wiring layers 19A and 19B and the resistor 12.

Notably, as described above, the conductive covering layers 18A and 18B do not cover the side surfaces of the first portions 13A and 14A of the first grounding metal lower and upper layers of the first-main-face-side wiring layer 19A, which side surfaces face the first-main-face-side wiring layer 19B; and the side surfaces of the second portions 13B and 14B of the first grounding metal lower and upper layers of the first-main-face-side wiring layer 19B, which side surfaces face the first-main-face-side wiring layer 19A. However, the non-covered portions are very small, and the remaining portions are covered by the conductive covering layers 18A and 18B. Therefore, the above-described action and effect is not impaired.

Also, portions of the second grounding metal layer 23 and the second conductor layer 25 formed on the second main face 11B of the substrate main body 11, which portions are exposed on the opposite sides of the third conductor layer 27, etc. located on the second grounding metal layer 23 and the second conductor layer 25 are removed through etching performed through an unillustrated mask member, whereby the side end surfaces of the second grounding metal layer 23 become flush with the side end surfaces of the third conductor layer 27, etc. As a result, the wiring substrate 10 as shown in FIG. 1 can be obtained.

Second Embodiment

Wiring Substrate

Figure 18:
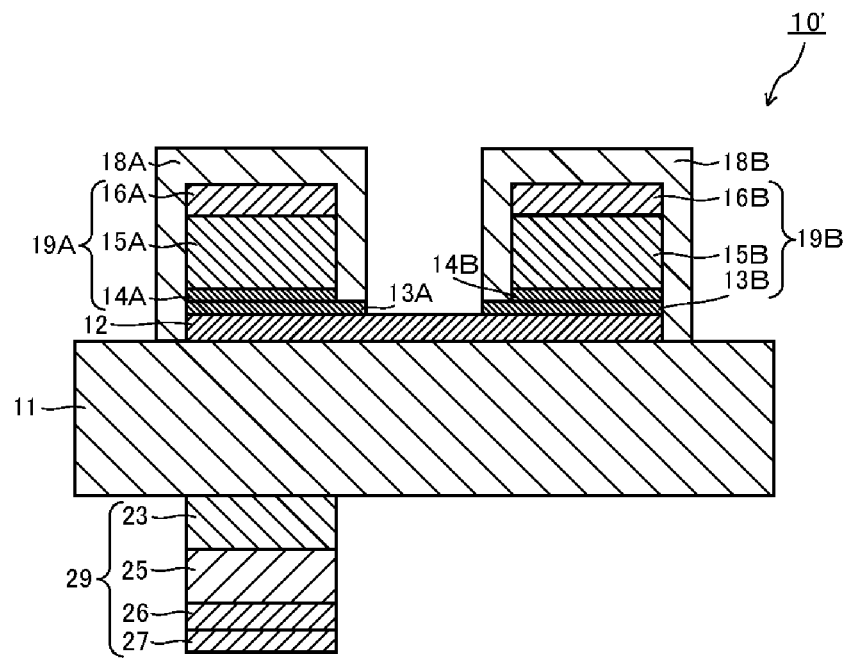
FIG. 18 is a sectional view schematically showing the structure of a wiring substrate according to a second embodiment.

FIG. 18 is a sectional view schematically showing the structure of a wiring substrate according to the present embodiment. Notably, structural elements similar or identical to those of the wiring substrate 10 shown in FIG. 1 are denoted by the same reference numerals.

A wiring substrate 10' of the present embodiment differs from the wiring substrate 10 of the first embodiment in that the conductive covering layers 18A and 18B are formed on the first main face 11A of the substrate main body 11 such that the conductive covering layers 18A and 18B cover the mutually facing side surfaces of the first-main-face-side wiring layers 19A and 19B. Specifically, the conductive covering layer 18A covers the side surface of the first portion 14A of the first grounding metal upper layer of the first-main-face-side wiring layer 19A, which side surface faces the first-main-face-side wiring layer 19B, and the conductive covering layer 18B covers the side surface of the second portion 14B of the first grounding metal upper layer of the first-main-face-side wiring layer 19B, which side surface faces the first-main-face-side wiring layer 19A.

However, the portions of the first-main-face-side wiring layers 19A and 19B which are not covered by the conductive covering layers 18A and 18B are very small (1 μm or less), and the greater portions of the upper and side surfaces of the first-main-face-side wiring layers 19A and 19B are covered by the conductive covering layers 18A and 18B. Therefore, as in the case of the first embodiment, it is possible to suppress the generation of whiskers of the first conductor layer which partially constitutes the first-main-face-side wiring layers 19A and 19B and production of undercuts of the first conductor layer, when these first-main-face-side wiring layers 19A and 19B are formed with their shapes being defined through etching.

Method of Manufacturing Wiring Substrate

Next, a method of manufacturing the wiring substrate 10' shown in FIG. 18 will be described.

Figure 19:
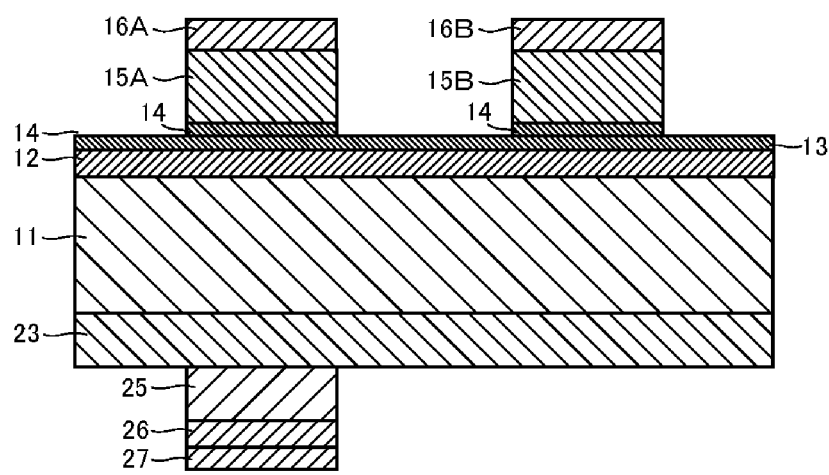
FIG. 19 is a sectional view showing a step of a method of manufacturing the wiring substrate according to the second embodiment.
Figure 20:
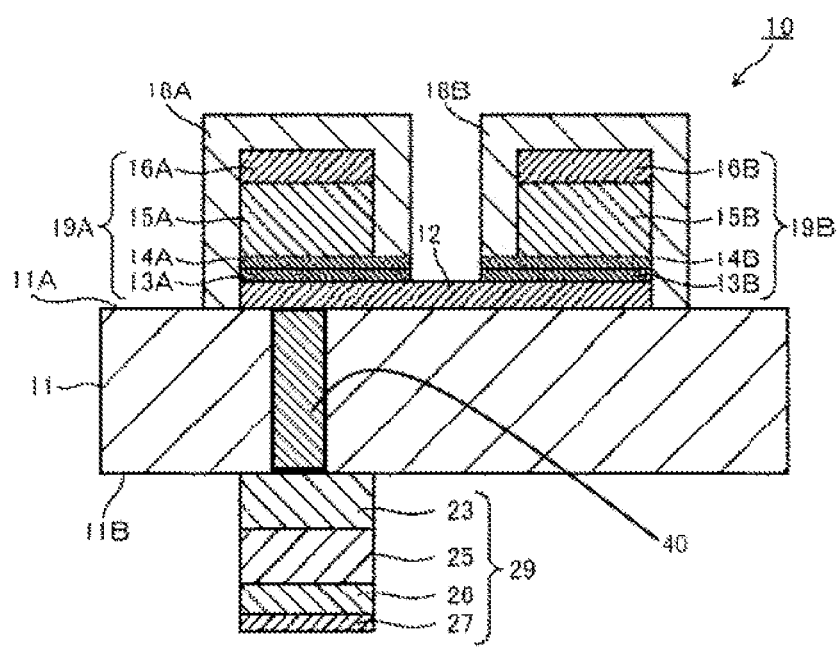
FIG. 20 is a sectional view schematically showing the structure of the wiring substrate according to the first embodiment, and further showing an exemplary via conductor(s).

FIG. 19 is a sectional view showing a step of the method of manufacturing the wiring substrate 10'. First, the structure as shown in FIG. 9 is obtained through the steps of the first embodiment shown in FIGS. 2 to 8. After that, as shown in FIG. 19, portions of the first grounding metal upper layer 14 which are exposed from the first and second portions 15A and 15B of the first conductor layer and the first and second portions 16A and 16B of the first conducive bonding layer are removed through etching performed by making use of an inorganic acid or an organic acid.

After that, steps similar to those of the first embodiment shown in FIGS. 10 to 17 are performed, whereby the wiring substrate 10' as shown in FIG. 18 can be obtained.

Also, as described above, the portions of the first grounding metal upper layer 14 which are exposed from the first and second portions 15A and 15B of the first conductor layer and the first and second portions 16A and 16B of the first conducive bonding layer are removed through etching performed by making use of an inorganic acid or an organic acid. Therefore, unlike the case of the first embodiment, on the side where the first-main-face-side wiring layers 19A and 19B are formed, the resist 34 is formed on the first grounding metal layer 13 in the steps shown in FIGS. 10 and 11, and the resist 37 and the plate-shaped resist mask 38 (third mask) are formed on the first grounding metal layer 13 in the steps shown in FIGS. 14 and 15.

Subsequently, in the steps shown in FIGS. 16 and 17, the conductive covering layers 18A and 18B are formed on the side surfaces of the resistor 12 so as to cover the mutually facing side surfaces of the first-main-face-side wiring layers 19A and 19B; i.e., the side surface of the first portion 14A of the first grounding metal upper layer of the first-main-face-side wiring layer 19A, which side surface faces the first-main-face-side wiring layer 19B, and the side surface of the second portion 14B of the first grounding metal upper layer of the first-main-face-side wiring layer 19B, which side surface faces the first-main-face-side wiring layer 19A. As a result, the wiring substrate 10' as shown in FIG. 18 can be obtained.

In the above, the present invention has been described in detail for specific examples thereof; however, the present invention is not limited to the details thereof, and various modifications and changes can be made without departing from the scope of the present invention.

DESCRIPTION OF REFERENCE NUMERALS

10: wiring substrate
11: ceramic multilayer wiring substrate
12: resistor
13A, 14A: first portion of first grounding metal layer
13B, 14B: second portion of first grounding metal layer
15A: first portion of first conductor layer
15B: second portion of first conductor layer
16A: first portion of first conducive bonding layer
16B: second portion of first conducive bonding layer
18A, 18B: conductive covering layer
19A, 19B: first-main-face-side wiring layer
23: second grounding metal layer
25: second conductor layer
26: second conducive bonding layer
27: third conductor layer
29: second-main-face-side wiring layer

What is claimed is:

1. A wiring substrate comprising:
a substrate main body having a first main face and a second main face opposite the first main face;
a resistor formed on the first main face;
a plurality of first-main-face-side wiring layers which are each formed on the resistor and which each include a grounding metal layer formed of a metal having a resistance lower than that of the resistor and a conductor layer formed on the grounding metal layer, the plurality of first-main-face-side wiring layers each having an upper surface and side surfaces;
a second-main-face-side wiring layer formed on the second main face; and
a via which is formed in the substrate main body and which establishes electrical connectivity between the plurality of first-main-face-side wiring layers and the second-main-face-side wiring layer,
the wiring substrate including a conductive covering layer which covers the upper surface and substantially covers the side surfaces of each of the plurality of first-main-face-side wiring layers wherein the conductive covering layer covers the side surfaces of each of the plurality of first-main-face-side wiring layers on a side, except where the grounding metal layers of each of the plurality of first-main-face-side wiring layers face each other.

2. The wiring substrate according to claim 1, wherein the conductive covering layer covers all the side surfaces of each of the plurality of first-main-face-side wiring layers.

3. The wiring substrate according to claim 1, wherein the grounding metal layer is formed of Cu or is formed of Cu and Ti.

4. The wiring substrate according to claim 1, wherein the conductor layer is formed of at least one metal selected from Cu and Ni.

5. The wiring substrate according to claim 1, wherein the conductive covering layer is formed of at least one metal selected from Ni and Au.

6. A method of manufacturing a wiring substrate according to claim 1, which includes a substrate main body having a first main face and a second main face opposite the first main face; a resistor formed on the first main face; two first-main-face-side wiring layers which are each formed on the resistor and which each include a first grounding metal layer formed of a metal having a resistance lower than that of the resistor and a conductor layer formed on the first grounding metal layer, each of the two first-main-face-side wiring layers having an upper surface and side surfaces; a second-main-face-side wiring layer formed on the second main face; and a via which is formed in the substrate main body and which establishes electrical connectivity between the two first-main-face-side wiring layers and the second-main-face-side wiring layer, the method comprising:
forming the resistor on the first main face such that the resistor is electrically connected to the via;
forming the first grounding metal layer on the resistor, the first grounding metal layer having a resistance lower than that of the resistor, and forming a second grounding metal layer on the second main face such that the second grounding metal layer is electrically connected to the via;
forming first and second mask layers having openings on the first and second grounding metal layers, respectively, and forming in the openings a first conductor layer and a second conductor layer on the first and second grounding metal layers, respectively, to thereby form the two first-main-face-side wiring layers and the second-main-face-side wiring layer;
removing the first and second mask layers, and forming a third mask layer on the first grounding metal layer between the two first-main-face-side wiring layers;
forming a conductive covering layer which covers the upper surface and the side surfaces of each of the two first-main-face-side wiring layers by performing electroplating while using the via and the first grounding metal layer as an electricity supply path; and removing the third mask layer and removing a portion of the first grounding metal layer located between the two first-main-face-side wiring layers.

* * * * *